United States Patent
Ning

(10) Patent No.: US 7,605,470 B2
(45) Date of Patent: Oct. 20, 2009

(54) DUMMY PATTERNS AND METHOD OF MANUFACTURE FOR MECHANICAL STRENGTH OF LOW K DIELECTRIC MATERIALS IN COPPER INTERCONNECT STRUCTURES FOR SEMICONDUCTOR DEVICES

(75) Inventor: Xian J. Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 358 days.

(21) Appl. No.: 11/611,332

(22) Filed: Dec. 15, 2006

(65) Prior Publication Data

US 2008/0142975 A1 Jun. 19, 2008

(30) Foreign Application Priority Data

Dec. 22, 2005 (CN) .......................... 200510111998

(51) Int. Cl.
*H01L 23/48* (2006.01)
(52) U.S. Cl. ............... 257/758; 257/E21.579; 257/E23.161; 438/687
(58) Field of Classification Search ........ 438/687; 257/758, E21.579, E23.161

See application file for complete search history.

(56) References Cited

U.S. PATENT DOCUMENTS

2005/0035457 A1 * 2/2005 Tomita et al. ............... 257/758
2005/0082577 A1 * 4/2005 Usui ........................... 257/211
2007/0281465 A1 * 12/2007 Otsuka ....................... 438/624

* cited by examiner

*Primary Examiner*—Trung Dang
(74) *Attorney, Agent, or Firm*—Townsend and Townsend and Crew LLP

(57) ABSTRACT

A method for fabricating a semiconductor device. The method includes providing a semiconductor substrate including a surface region. The method forms a first interlayer dielectric overlying the surface region and forms an interconnect layer overlying the first interlayer dielectric layer. The method also forms a low K dielectric layer overlying the interconnect layer, which has a predetermined shape. The method forms a copper interconnect layer overlying the low K dielectric layer. In a preferred embodiment, the low K dielectric layer maintains the predetermined shape using a dummy pattern structure provided within a portion of the low K dielectric layer to mechanically support and maintain the predetermined shape of the low K dielectric layer between the interconnect layer and the copper interconnect layer.

19 Claims, 11 Drawing Sheets

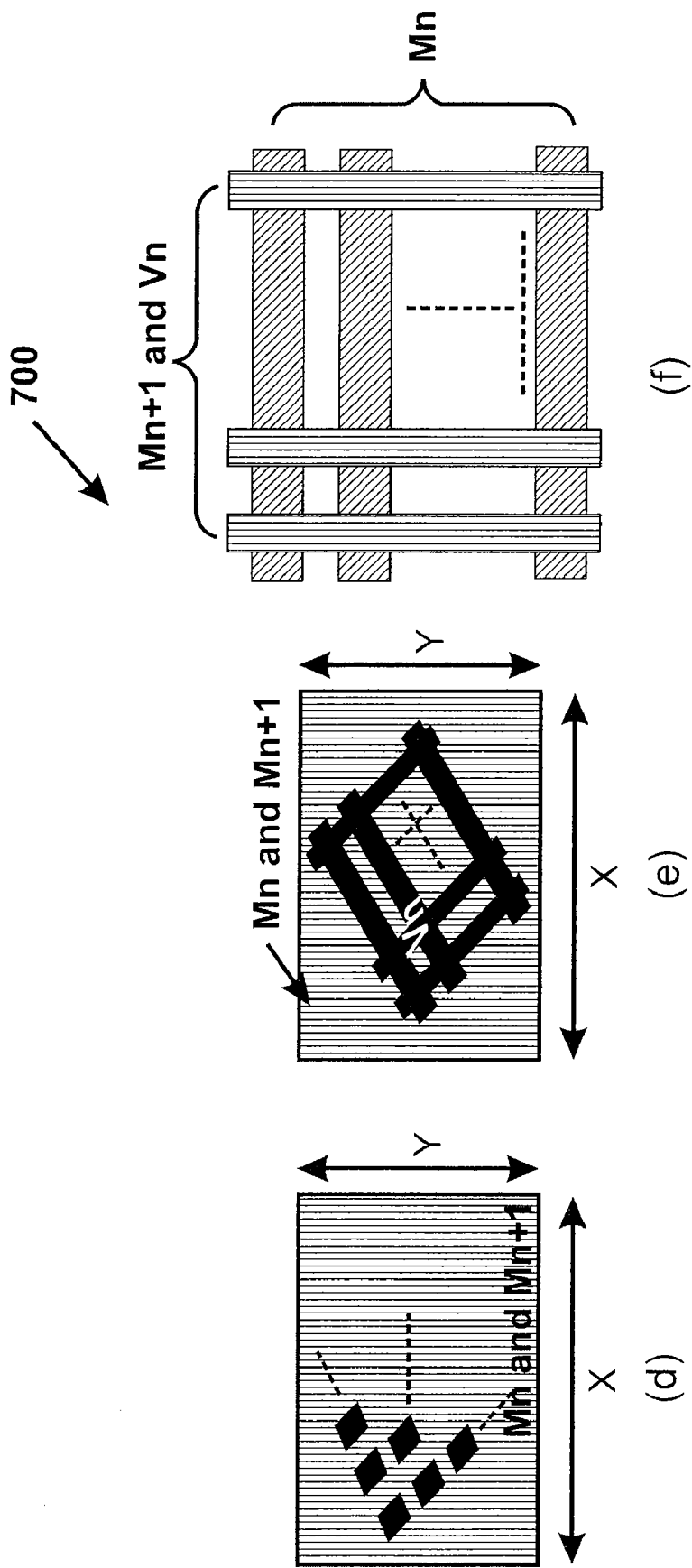
FIGURE 7 (cont'n)

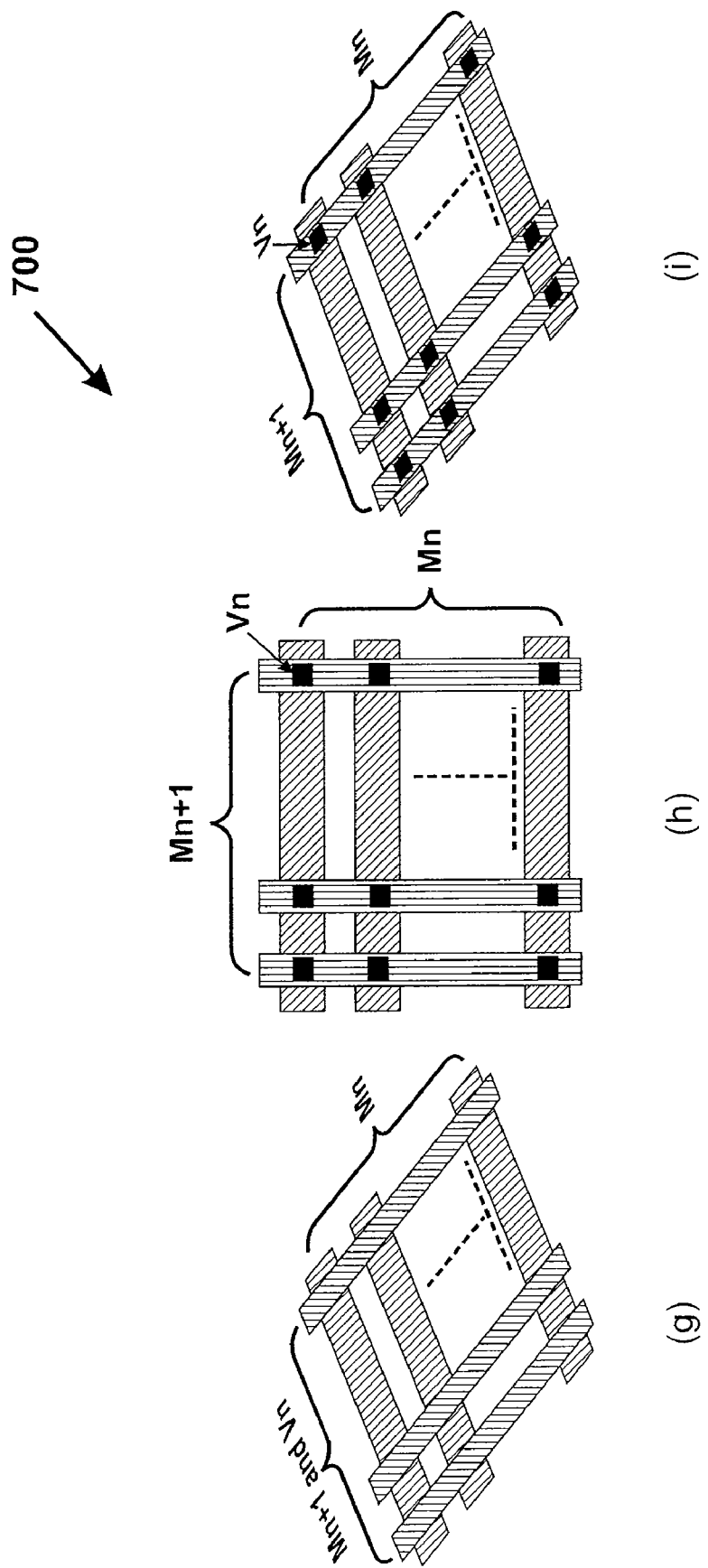
FIGURE 7 (cont'n)

DUMMY PATTERNS AND METHOD OF MANUFACTURE FOR MECHANICAL STRENGTH OF LOW K DIELECTRIC MATERIALS IN COPPER INTERCONNECT STRUCTURES FOR SEMICONDUCTOR DEVICES

CROSS-REFERENCES TO RELATED APPLICATIONS

This patent application claims priority to Chinese Patent Application Number 200510111998.3; filed on Dec. 22, 2005, commonly assigned, and hereby incorporated by reference for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits and their processing for the manufacture of semiconductor devices. In particular, the invention provides a method and structures for manufacturing metal interconnect structures for integrated circuit devices. More particularly, the invention provides one or more dummy structures to maintain a dielectric layer within a predefined region and between a pair of metal layers according to a specific embodiment. But it would be recognized that the invention has a much broader range of applicability.

Over the past decades, integrated circuits have evolved from a handful of interconnected devices fabricated on a single chip of silicon to millions of devices. Performance and complexity are far beyond what was originally imagined. In order to achieve improvements in complexity and circuit density (i.e., the number of devices capable of being packed onto a given chip area), the size of the smallest device feature, also known as the device "geometry," has become smaller with each generation of integrated circuits. Certain semiconductor devices are now being fabricated with features less than a quarter of a micron across.

Increasing circuit density has not only improved the complexity and performance of circuits but also provided lower costs to consumers. Conventional semiconductor fabrication plants often costs hundreds of millions or even billions of U.S. dollars to construct. Each fabrication facility has a certain capacity measured in tens of thousands of wafer starts per month. Each wafer also has a certain number of potential chips. By manufacturing individual devices smaller and smaller, more devices are packed in a given area of semiconductor, which increases output of the fabrication facility. Making devices smaller is always very challenging, as each process for the manufacture of semiconductor devices has a limit. That is to say, a given process typically only works down to a certain feature size, and then either the process or the device layout should be changed.

Costs of operating fabrication facilities have also increased dramatically. As many know, many U.S. fabrication facilities that were operable in the 1970's and 1980's no longer exist. Many of such fabrication facilities migrated to Japan in the 1980's and then to Korea and Taiwan in the 1990's. As demand for lower cost fabrication facilities continues, China has now become a choice geographic location for fabrication facilities to start up. Many companies have announced plans to begin manufacturing facilities in China. Such companies include, but are not limited to, Motorola, Inc., Taiwan Semiconductor Manufacturing Corporation of Taiwan, also called TSMC, and others. Although labor costs may be somewhat lower in China, there are still many costs that still need to be reduced or even eliminated as the demand for lower cost silicon continues!

An example of a process that has limitations based upon a given feature size is the formation of contact and/or bonding structures for advanced devices using low K dielectric materials. That is, such contact structures using low K dielectrics often become damaged during the manufacturing of the integrated circuit. The damage causes reliability and/or device failures. These and other limitations of the conventional contact structures can be found throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. In particular, the invention provides a method and structures for manufacturing bond pad structures for integrated circuit devices. More particularly, the invention provides a grid structure to maintain a dielectric layer within a predefined region and between a pair of metal layers while a bonding pad structure is provided on a portion of the predefined region according to a specific embodiment. But it would be recognized that the invention has a much broader range of applicability.

In a specific embodiment, the present invention provides a method for providing one or more redundant vias between at least a pair of metal interconnect layers. In a specific embodiment, the one or more redundant vias form a "dummy pattern." The dummy pattern can include at least three consecutive layers in a process flow, e.g., Mn, Vn, Mn+1, where "n" is an integer number of one or greater. In a specific embodiment, the dummy pattern is located spatially about 1 um to 5 um away from a portion of a functional circuit. In a specific embodiment, the dummy pattern includes a plurality of vias that are mechanically connected to the two metal layers that sandwich them in between for mechanical strength and support. Depending upon the embodiment, the dummy pattern can have a variety of shapes and sizes, e.g., rectangular, or any other shape. In a specific embodiment, the dummy pattern is particularly helpful in interconnects using copper/low K dielectric materials where the modulus of the low K material is much lower than conventional silicon oxide. In a specific embodiment, the dummy pattern or patterns are formed together or simultaneously with the process of forming the interconnect structure and include portions of the layers used for the interconnect structures themselves. In a specific embodiment, the dummy pattern includes a via size that ranges from about 50 to about 500 nm. Of course, there can be various modifications, alternatives, and variations.

In a specific embodiment, the present invention provides a semiconductor device, e.g., NMOS, CMOS. The device has a semiconductor substrate (e.g., silicon, silicon on insulator, epitaxial silicon) including a surface region. The device has a first interlayer dielectric overlying the surface region and an interconnect layer overlying the first interlayer dielectric layer. In a preferred embodiment, the interconnect layer includes a plurality of interconnect regions for electrically coupling one or more circuit elements together. The device has a low K dielectric layer overlying the interconnect layer. The device has a predetermined shape characterizing the low K dielectric layer. The device has a copper interconnect layer (e.g., single damascene, dual damascene) overlying the low K dielectric layer. The device has a dummy pattern structure provided within a portion of the low K dielectric layer to provide mechanical support to maintain the predetermined shape of the low K dielectric layer. In a preferred embodiment, the predetermined shape is maintained between the interconnect layer and the copper interconnect layer.

In an alternative specific embodiment, the present invention provides a method for fabricating a semiconductor device. The method includes providing a semiconductor substrate including a surface region. The method forms a first interlayer dielectric overlying the surface region and forms an interconnect layer overlying the first interlayer dielectric layer. The method also forms a low K dielectric layer overlying the interconnect layer, which has a predetermined shape. The method forms a copper interconnect layer overlying the low K dielectric layer. In a preferred embodiment, the low K dielectric layer maintains the predetermined shape using a dummy pattern structure provided within a portion of the low K dielectric layer to mechanically support and maintain the predetermined shape of the low K dielectric layer between the interconnect layer and the copper interconnect layer.

In a specific embodiment, the present invention can include one or more of the features noted below.
1. In a specific embodiment, the present method and structure provides redundant via patterns (for mechanical strength) used in the form of sandwiched structure bonded by two adjacent metal layers.
2. In an alternative specific embodiment, the shapes of redundant via patterns can be varied as described above and well as throughout the present document.
3. The sandwiched structures can be repeated to the multi-layered structure, including, for example, metal 1 (M1)/via 1 (V1)/metal 2 (M2)/via 2 (V2)/metal 3 (M3) according to a specific embodiment.
4. In a preferred embodiment, redundant patterns are placed where they do not affect the circuit performance electrically.

Depending upon the embodiment, one or more of the above features can be included. Of course, there can be other variations, modifications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less or 65 nanometers and less. Additionally, the invention provides for increased strength in bonding pad structures that may employ Low K dielectric materials, e.g., dielectric constant of $SiO_2$ of about k=3.5 and less (e.g., doping with fluorine to produce fluorinated silica glass, or commonly termed FSG), dielectric constant K=3 and less, or K=2.9 and less. Preferably, the present method and structures prevents any delaminating of layers using low K dielectric and bonding due to compression influences associated with the bonding pad. Depending upon the embodiment, one or more of these benefits may be achieved. These arid other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of semiconductor devices are provided. In particular, the invention provides a method and structures for manufacturing metal interconnect structures for integrated circuit devices. More particularly, the invention provides one or more dummy structures to maintain a dielectric layer within a predefined region and between a pair of metal layers according to a specific embodiment. But it would be recognized that the invention has a much broader range of applicability.

Copper wires are usually embedded in the dielectric materials by damascene technologies, such as dual damascene structures. Since circuit structures including the embedded copper and dielectric materials often have a large difference in thermal expansion coefficients and modulus, such structures often suffer from deformation during thermal cycles during wafer processes and during the final packaging processes associated with the manufacture of integrated circuits. This limitation is especially pronounced for copper embedded into low dielectric constant (low k) materials, which possess modulus that are much smaller than conventional silicon oxide materials. The deformation of dielectrics can displace metal vias causing via opens and other problems. The deformation can also cause film de-lamination and cracking. In order to mechanically strengthen the dielectric films in the interconnect structure, the present invention provides a method and structure for adding redundant metal/via/metal sandwich structures in predetermined spatial regions, which are substantially open in the integrated circuit structure. The redundant structures are often designed in a special pattern to maximize the mechanical stability according to a specific embodiment. Further details of the present invention can be found throughout the present specification and more particularly below.

Figure 1:
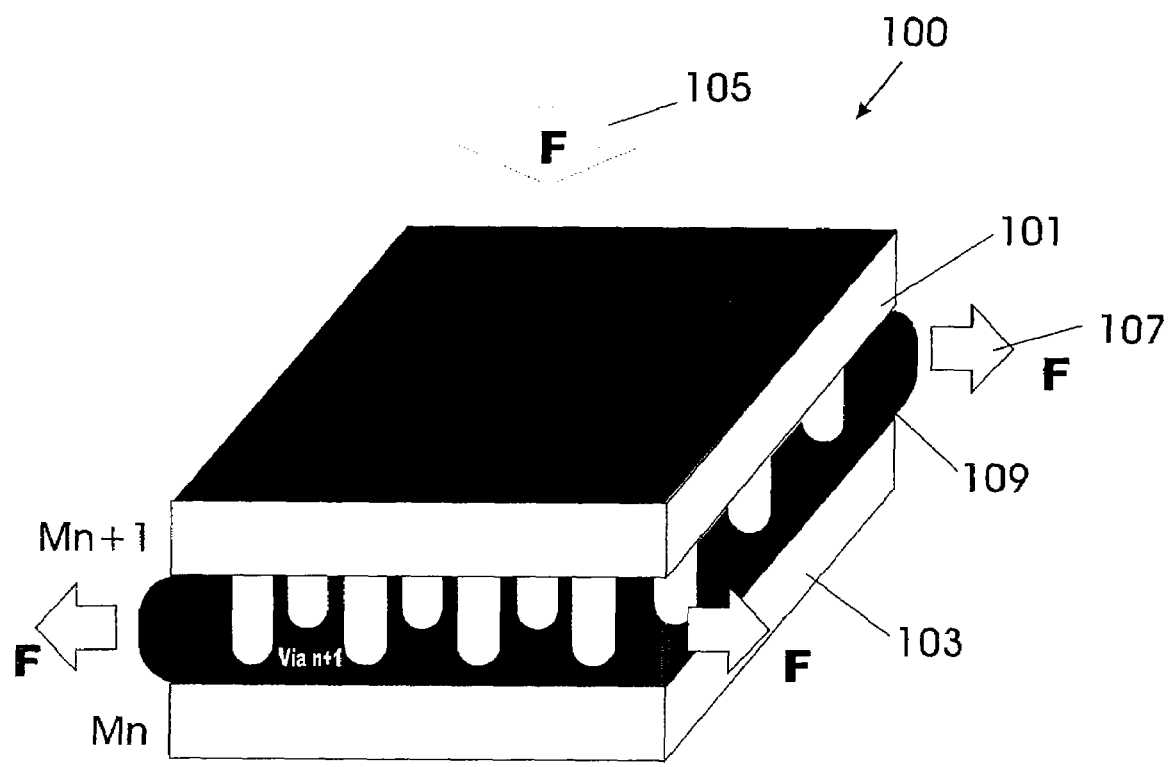
FIG. 1 is a simplified three dimensional diagram of a contact structure for a semiconductor device according to an embodiment of the present invention.

FIG. 1 is a simplified three dimensional diagram of a contact structure 100 for a semiconductor device according to an embodiment of the present invention. This diagram is merely an example, which should not unduly limit the scope of the claims herein. One of ordinary skill in the art would recognize many variations, modifications, and alternatives. In a specific embodiment, the device has a semiconductor substrate, e.g., silicon wafer. The device has a plurality of gate structures (e.g., MOS gate structures) formed on a portion of the semiconductor substrate. The device also has a gate dielectric layer and isolation structures, e.g., trench isolation. The device has a first interlayer dielectric (e.g., low K, BPSG, PSG, FSG) overlying the gate structures. In a preferred embodiment, the first interlayer dielectric layer has a substantially flat surface region. Depending upon the embodiment, there can be other variations, modifications, and alternatives.

In a specific embodiment, the device has a first copper interconnect layer 101 overlying the substantially flat surface region of the first interlayer dielectric layer. The device also has a first low K dielectric layer 109 overlying the first copper interconnect layer. A second copper interconnect layer 103 is overlying the low K dielectric layer. In between the first and second copper layers is a copper ring structure (not shown, but see the figures below) enclosing an entirety of an inner region of the first low K dielectric layer. In a preferred embodiment, the copper ring structure is provided between the first copper interconnect layer and the second copper interconnect layer to maintain the inner region of the first low K dielectric layer. A bonding pad structure is overlying a region within the inner region. As shown without the ring structure, the dielectric material in between the two metal plates transfer the applied force 105 into the dielectric material 107, which causes force to neighboring circuits, which can lead to failure. As shown, the metal plate structure underneath a bond pad has parallel plates sandwich an array of metal vias produced either by single or dual damascene processes according to a specific embodiment. The stress induced dielectric deformation are schematically illustrated. As can be seen, the excess materials pushed out of the sandwich will make the surrounding dielectrics compression and may result in delaminating. Also, the dielectric inside the sandwiches may crack under the stress. Further details on how to overcome the limitation among others will be described throughout the present specification and more particularly below.

Figure 2:
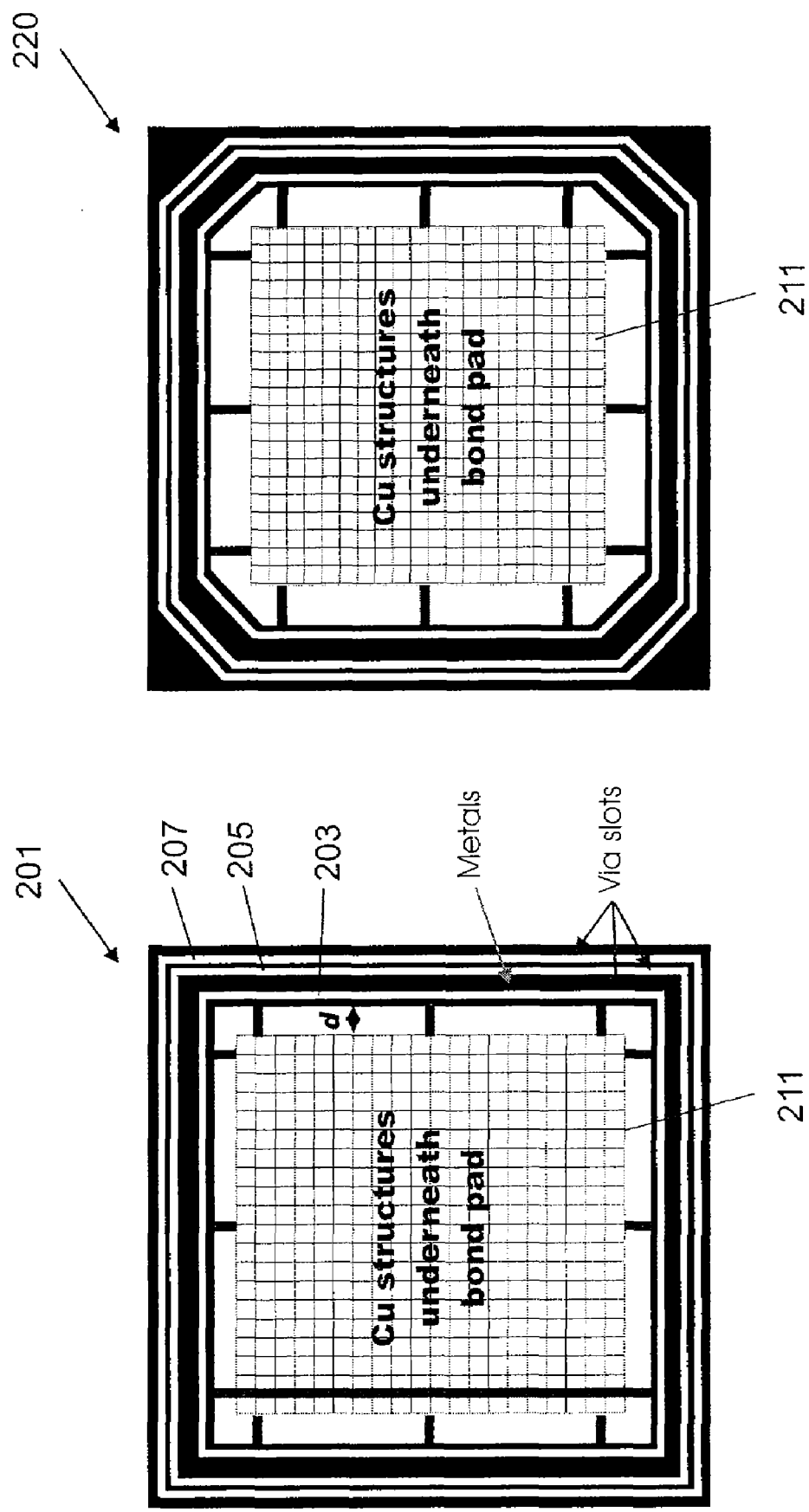
FIG. 2 are simplified top-view diagrams of contact structures according to embodiments of the present invention.

FIG. 2 are simplified top-view diagrams of contact structures 201, 220 according to embodiments of the present invention. This diagram is merely an example, which should not unduly limit the scope of the claims herein. One of ordinary skill in the art would recognize many variations, modifications, and alternatives. As shown, each of the contact structures 201 220 represent a top view of a metal pad structure, which will be underlying a bond pad structure. Each of the structures 211, which are copper based, including one or more ring structures 203, 205, 207 according to a specific embodiment. Each of the ring structures is provided during via formation of the copper structures according to a specific embodiment. Each of the structures is continuous and surrounds the dielectric material within a center portion of the copper structures.

In a preferred embodiment, each of the ring structures is bounded by the first copper interconnect layer and the second copper interconnect layer. Each of the ring structures can also have a dielectric material in between them according to a specific embodiment. As shown, the structure 201 is rectangular shaped and structure 220 has a round cornered polygon shape according to a specific embodiment. Depending upon the embodiment, there can be other shapes and sizes, including annular, circular, square, trapezoidal, any combination of these, among others. Of course, one of ordinary skill in the art would recognize many variations, modifications, and alternatives.

Figure 3:
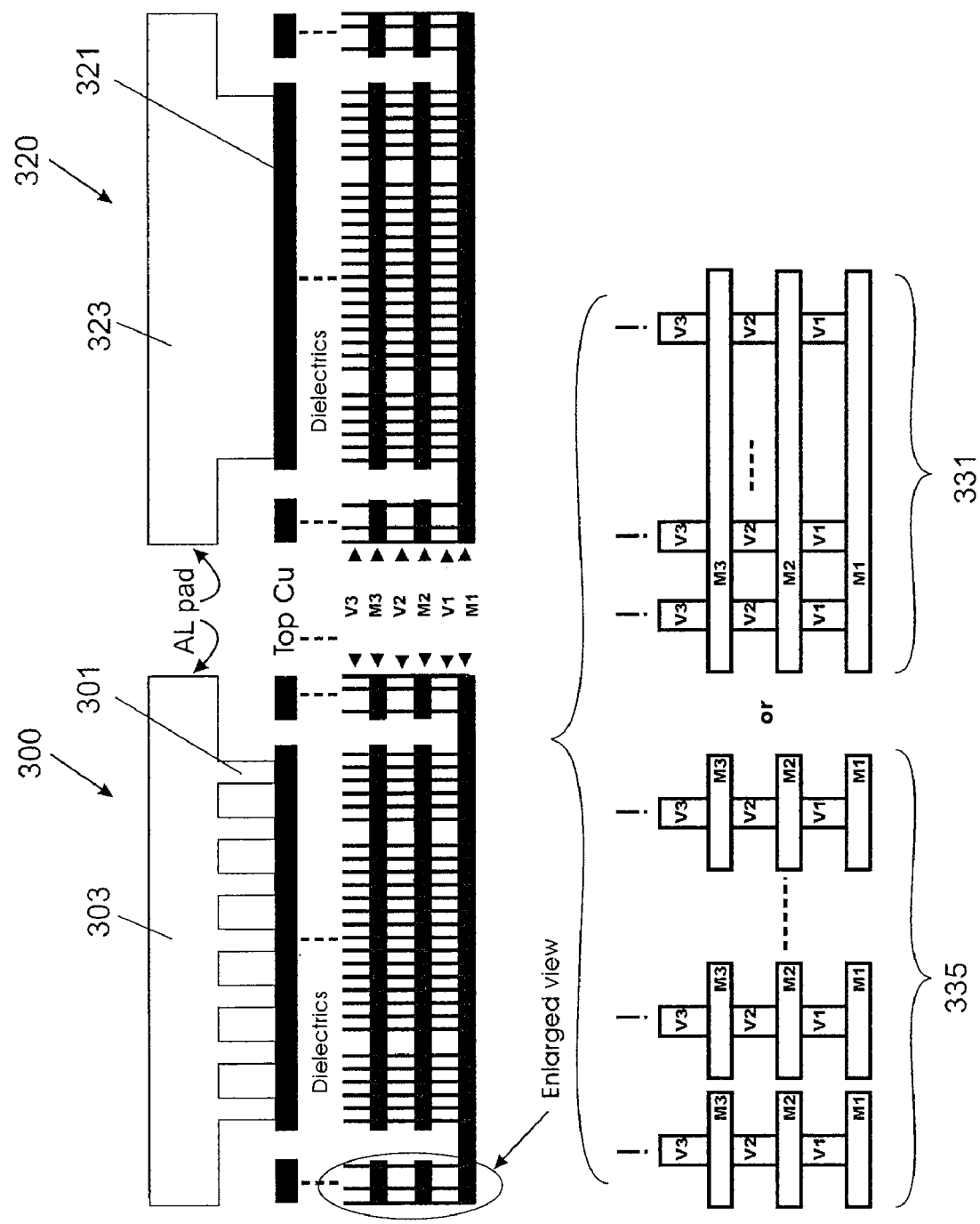
FIG. 3 are simplified side-view diagrams of contact structures according to embodiments of the present invention.

FIG. 3 are simplified side-view diagrams of contact structures 300, 320 according to embodiments of the present invention. This diagram is merely an example, which should not unduly limit the scope of the claims herein. One of ordinary skill in the art would recognize many variations, modifications, and alternatives. As shown, the contact structures illustrate cross-sectional views of bonding pad structures according to an embodiment of the present invention. In a specific embodiment, the cross-sectional view includes a top aluminum bond pad 303 having a patterned bottom portion 301, which electrically and physically connects to the copper metal layer. In a specific embodiment, the bond pad 323 has a flat bottom portion, which is continuous 321, and electrically and physically couples to the copper metal layer. The structure also has a plurality of metal ring structures 335 or a single ring structure 331 according to a specific embodiment. Each of the ring structures seals the dielectric material within the center region of the ring structure and provides mechanical support between each of the copper metal plates according to a specific embodiment. Further details of the present metal structures and methods can be found throughout the present specification and more particularly below.

Figure 3A:
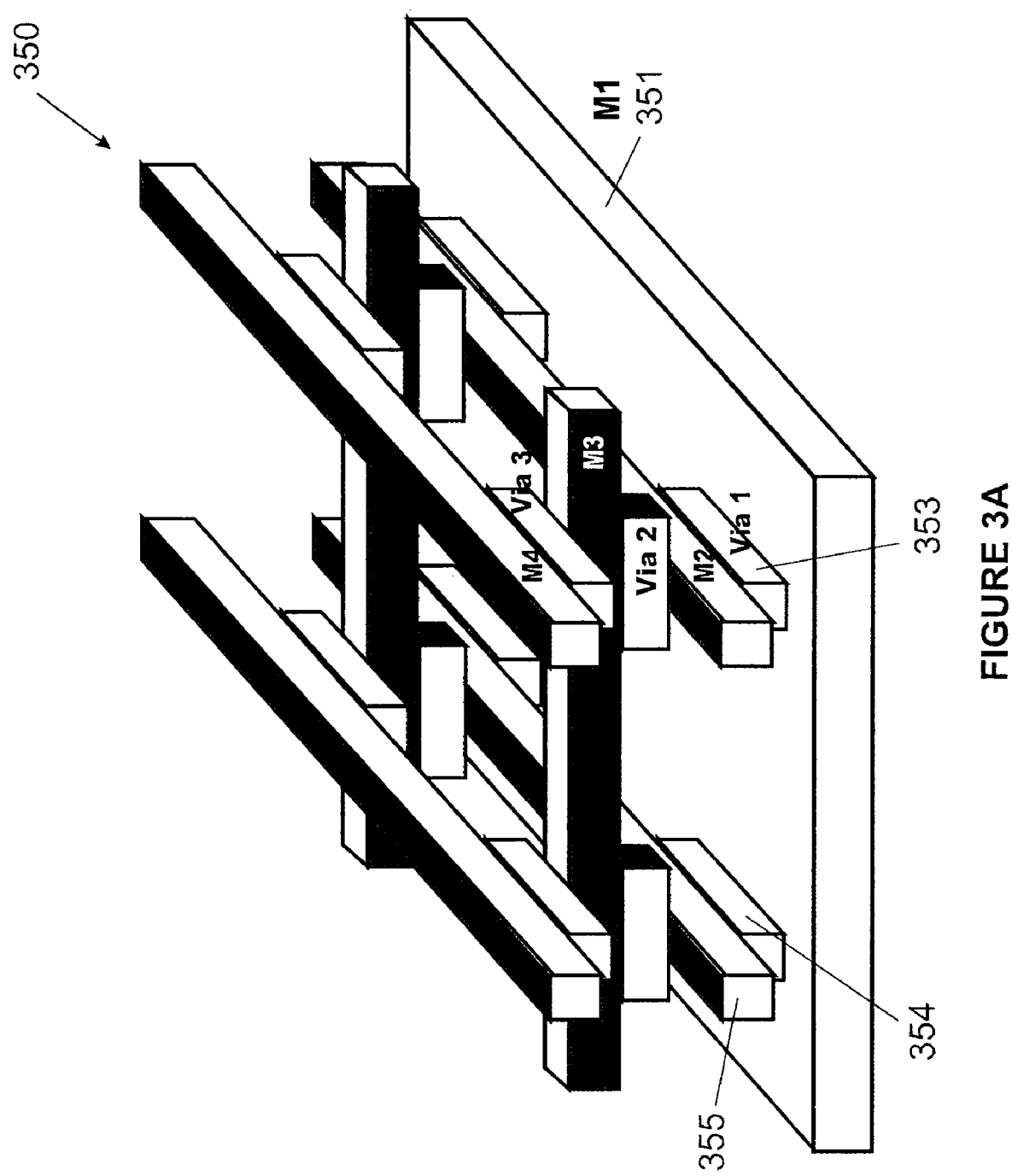
FIG. 3A is a simplified three dimensional view diagram of a contact structure according to an embodiment of the present invention.

FIG. 3A is a simplified three dimensional view diagram of a contact structure 350 according to an embodiment of the present invention. These diagrams are merely examples, which should not unduly limit the scope of the claims herein. One of ordinary skill in the art would recognize many variations, modifications, and alternatives. As shown, the metal stack (e.g., via 1, via 2, via 3, M2, M3, M4) is provided underneath a bond pad (not shown, which includes a copper plate and overlying aluminum layer). Depending upon the embodiment, the bond pad includes one or more metals that are connected through one or more rectangular vias and are arranged orthogonal to the next layer. As shown, the structure includes via structures and metal line structures, e.g., M1, M2, M3, M4. Depending upon the embodiment, via n can be arranged parallel to Mn and/or be arranged in a cross-shaped with one arm parallel to a metal above it and the other to the metal below it. In a specific embodiment, the bond pad is then formed on top of and overlying the present structure either by placing it directly on top for wire bonding or redistributed to the designed pattern on the next metal layer, e.g., aluminum alloy, copper, copper alloy, or other conductive materials. Of course, there can be other variations, modifications, and alternatives.

In a specific embodiment, the present invention provides a semiconductor device with the bond pad structure 350, as shown. The device has a semiconductor substrate and a plurality of gate structures. The device has a first interlayer dielectric overlying the gate structures. The device has a first copper interconnect layer 351 M1 overlying the first interlayer dielectric layer according to a specific embodiment. The first layer is a plate that is substantially homogeneous and forms a sheet structure. The device has a first low k dielectric layer 352 overlying the first copper interconnect layer. In a specific embodiment, the dielectric material can be selected from $SiO_x$, $SiC_x$, $SiN_x$, $SiO_xF_y$, $SiO_xC_y$, $SiO_xC_yF_z$, carbon like diamond produced by CVD or/and PECVD, low k dielectric called SiLKTM dielectric from Dow Chemical with a k-value of 2.65, hydrogen silsesquioxane (HSQ), polyimide produced spin-on technology, and other dielectric materials. A predetermined shape characterizes the first low k dielectric layer according to a specific embodiment. A patterned second copper interconnect layer (see via 1 layer) is overlying the first copper interconnect layer and enclosing a portion of the first low k dielectric layer.

In a specific embodiment, the device has a plurality of first lines 353 via 1 in a first direction made from a first portion of the patterned second copper interconnect layer. The device has a plurality of second lines 354 in a second direction made from a second portion of the patterned second copper interconnect layer. The device has a grid structure from the plurality of first lines and the plurality of second lines. The device has a bonding pad structure overlying a portion of the grid structure. The grid structure provides mechanical support to maintain the predetermined shape of the first low k dielectric layer. As shown, there can also be other metal layers formed as one or more lines, which are stacked in a "log cabin type" configuration to form an effective thickness between the first metal plate and an upper metal plate, which will be coupled to a bonding pad structure. Of course, there can be other variations, modifications, and alternatives.

On semiconductor substrate where the devices are built and contacts to the gate and active area are made embedding in the dielectric materials, a first inter-metal dielectric material is deposited. Depending upon the embodiment, the first dielectric material can include $SiN_x$, $SiO_x$, $SiO_xF_y$, $SiC_x$, $SiO_xC_y$, $SiO_xN_y$, or the combination of these, and others, depending upon the specific embodiment. As further shown in FIG. 3A, metal layer M1 plate has a plurality of patterns that are formed underneath a bond pad, which is formed using a single damascene process. Following M1 deposition and chemical mechanical polishing (CMP), another dielectric material is deposited. Via 1 pattern 353 is formed in the dielectric layer. The rectangular vias 353, 354 are formed using the same and/or similar processes as vias for interconnects according to a specific embodiment. The M2 355 pattern is formed superimposing via 1 using dual-damascene processes according to a specific embodiment. The via 1/M2 processes repeats to form multi-layer metal interconnect structures according to a specific embodiment. That is, via 1 and M2 are formed using dual damascene processes. These processes are repeated for via 2 and M3, and repeated again using via 3 and M4 according to a specific embodiment. The method forms a bond pad on top of the repeating grid structure according to a specific embodiment. The bond pad can be made of a suitable material such as aluminum, copper, aluminum alloy, copper alloy, or any combination of these, and others. In a specific embodiment, the bond pad can also be re-distributed in a predetermined pattern for flip-chip type packaging. Of course, there can be other variations, modifications, and alternatives.

Certain benefits can be achieved using the present method and structure. As merely an example, the metal and via structures are provided underneath the bond pad. Depending upon the embodiment, an advantage of the present structure is to have a reduced and/or minimum force exerted on the interlayer dielectric to avoid the deformation of the dielectric films, which are provided between the lower plate and upper plate that couples to the bonding pad. In a specific embodiment, internal and/or external thermal and/or mechanical forces provided on the M1 or upper plate include a sandwiched structure of metal bar members that are made of a stronger material and can withstand these force without failure. Of course, there can be other variations, modifications, and alternatives.

Figure 4:
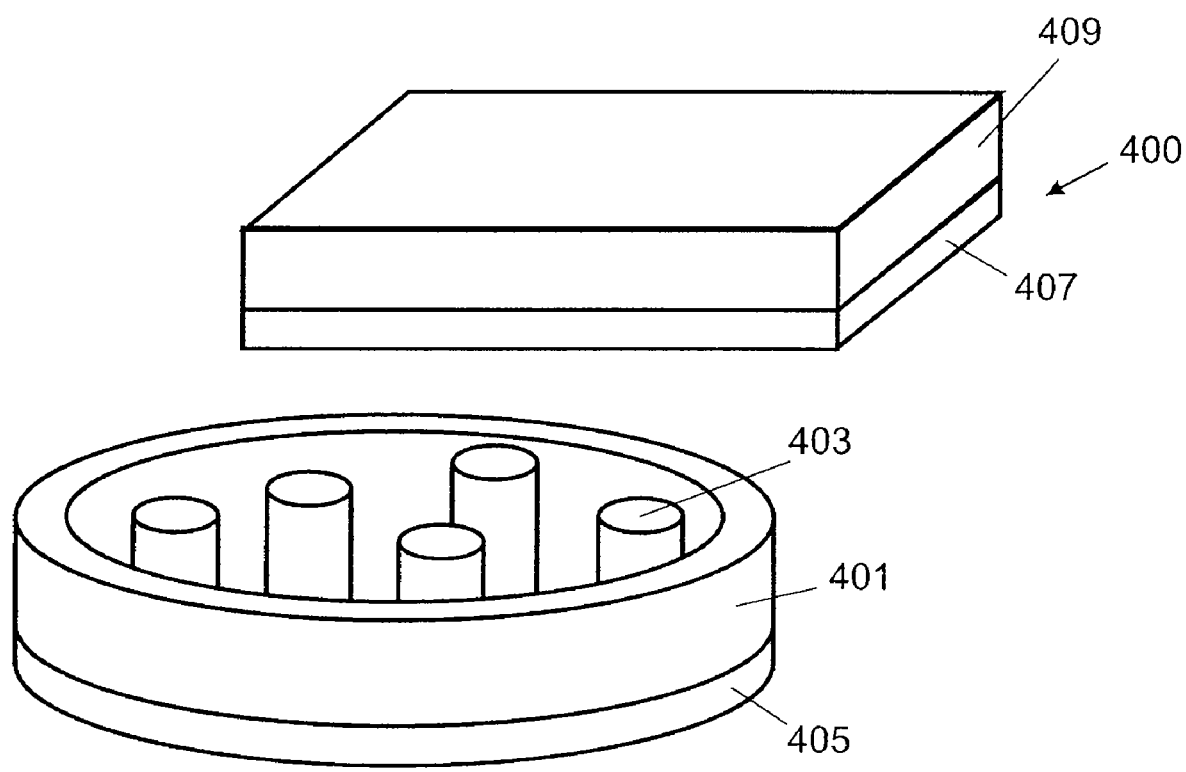
FIGS. 4 and 5 are simplified three dimensional diagrams of contact structures for semiconductor devices according to embodiments of the present invention.
Figure 5:
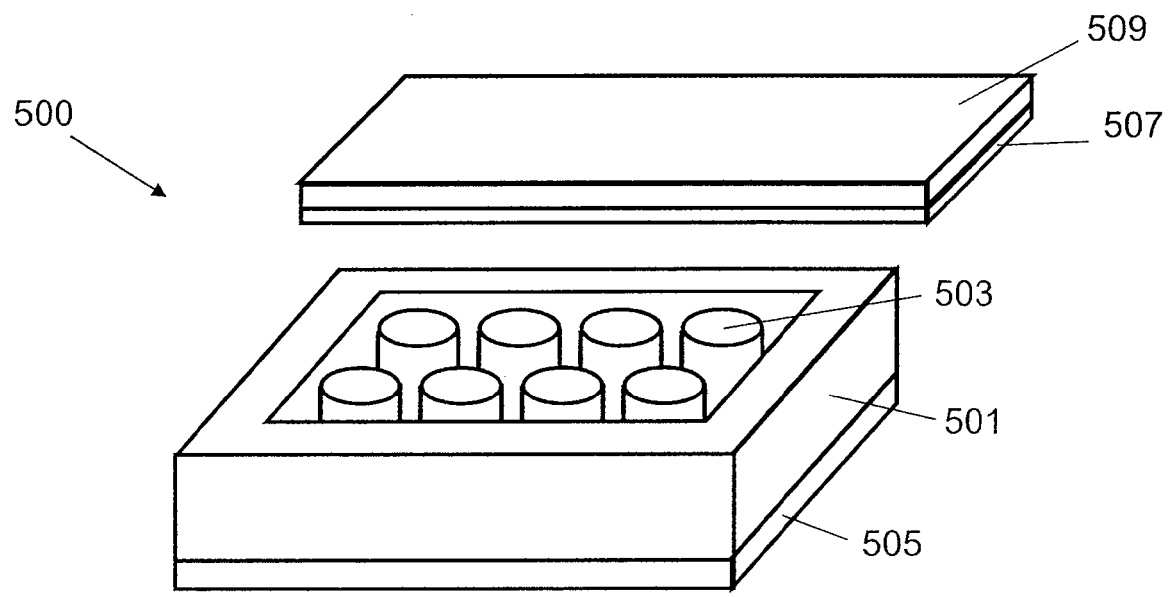

FIGS. 4 and 5 are simplified three dimensional diagrams of contact structures 400, 500 for semiconductor devices according to embodiments of the present invention. These diagrams are merely examples, which should not unduly limit the scope of the claims herein. One of ordinary skill in the art would recognize many variations, modifications, and alternatives. As shown, the diagrams are exploded views, which include ring structures 401, 501, a plurality of plug structures 403, 503, a lower plate 405, 505, an upper plate 407, 507, and a bonding pad structure 409, 509, according to a specific embodiment. That is, each of the ring structures can be combined with the grid structure, which has been previously described. Of course, there can be other variations, modifications, and alternatives.

Figure 6:
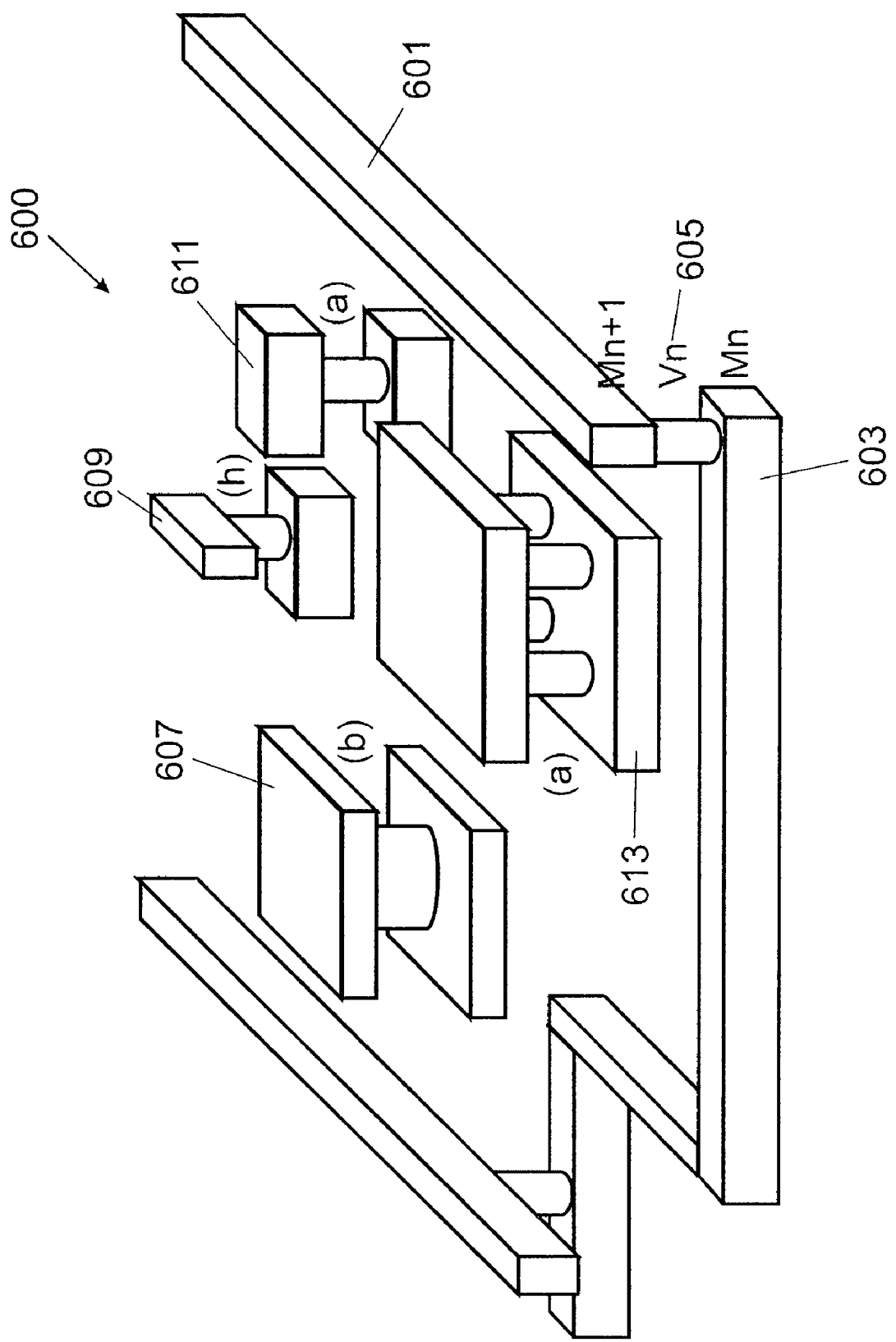
FIG. 6 is a simplified three dimension diagram of dummy structures for interconnects according to an embodiment of the present invention.

FIG. 6 is a simplified three dimension diagram of dummy structures for interconnects according to an embodiment of the present invention. This diagram is merely an example, which should not unduly limit the scope of the claims herein. One of ordinary skill in the art would recognize modifications, alternatives, and variations. As shown, wires at Mn 603 and Mn+1 601 layers are connected through Vn 605, which is a via structure At an empty space, via redundant patterns are inserted. For illustration purpose, four different types of via redundant patterns 609, 611, 607, 6133 are shown. As shown, the dummy structures are provided within a open spatial region between active interconnect structures according to a specific embodiment. The open spatial region is also filled with a dielectric material such as low k dielectric or other suitable layers according to a specific embodiment. Further details of these dummy structures can be found throughout the present specification and more particularly below.

Figure 7:
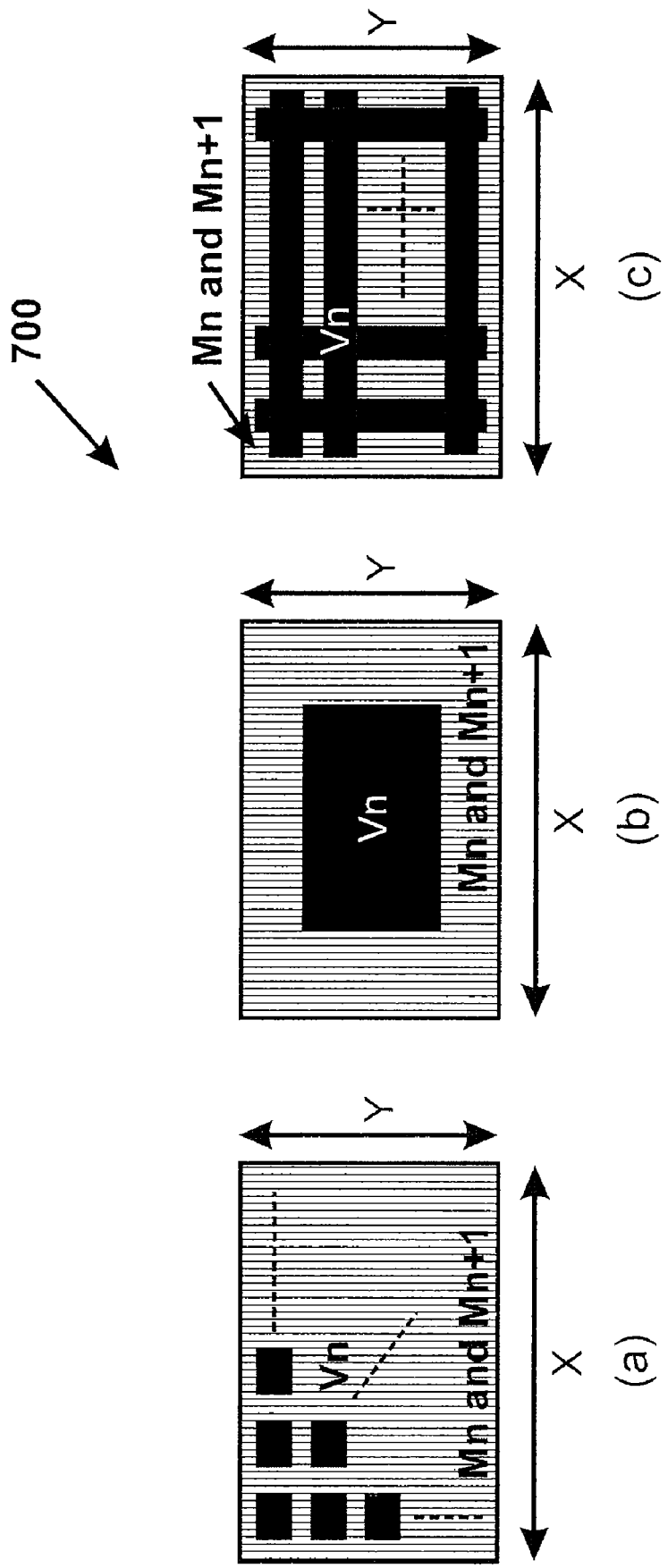
FIG. 7 illustrates various top-view diagrams of dummy structures according to embodiments of the present invention.

FIG. 7 illustrates various top-view diagrams of dummy structures 700 according to embodiments of the present invention. This diagram is merely an example, which should not unduly limit the scope of the claims herein. One of ordinary skill in the art would recognize modifications, alternatives, and variations. As shown, the dummy structures can be any suitable shape and size according to a specific embodiment. As merely an example, the top-view schematic diagrams are provided. Depending upon the embodiment, the dummy pattern can include one or more structures to fill up a space within a predetermined region of space within the integrated circuit device. For easy cross-referencing, the following reference letters have been provided.

(a) In a specific embodiment, the dummy structure includes at least two metal plates on adjacent layers, (Mn and Mn+1), which are overlying each other, and sandwiched together with an array of vias in between them. As an example, the via and associated spacing between two via structures can range from about 50 nm to about 500 nm, but can be other dimensions depending upon the embodiment As shown, the vias are configured to form an array structure that includes "n" rows and "m" columns, where n is an integer 1, 2, 3, ... and m is an integer 1, 2, 3, ... Depending upon the embodiment, the metal plates X and Y range in dimension from about 5 nm to 5 um,. but can be other dimensions. Of course, there can be other variations, modifications, and alternatives.

(b) In an alternative specific embodiment, the dummy structure includes at least two metal plates on adjacent layers, (Mn and Mn+1) and single large via sandwiched in between the two layers. In a specific embodiment, the via can be shaped as a square, circular, ellipse or polygon, or any combination of these. In a specific embodiment, the via has a size that can range from 5 nm to 5 um according to a specific embodiment. The metal plates X and Y have a dimension that ranges from about 5 nm to about 5 um according to a specific embodiment Of course, there can be other variations, modifications, and alternatives.

(c) In a specific embodiment, the present method and structure has at least two metal plates on adjacent layers, (Mn and Mn+1) and orthogonal graded via slots and/or structures sandwiched in between the layers. In a specific embodiment, via slots among the slots can have a dimension that varies in size from about 50 nm to about 5 um. Depending upon the specific embodiment, the via slots include a count or number in either direction from about 1, 2, 3 . . . In a specific embodiment, the slots can include a spacing ranging from about 50 nm to 5 um. The metal plates X and Y can have a size ranging from 5 nm to 5 um according to a specific embodiment. Of course, there can be other variations, modifications, and alternatives.

(d) In an alternative specific embodiment, the present method and structure has at least two metal plates on adjacent layers, (Mn and Mn+1) and an array of vias sandwich in between the two layers. In a specific embodiment, the vias have a spacing between any two of them that range from about 50 nm to about 5 um. In a specific embodiment, the array can be 45 degree rotated with respect to an edge of the metal layers, which includes "n" rows and "m" columns, where n=1, 2, 3, . . . and m=0, 1, 2, 3 . . . . In a specific embodiment, the metal plates X and Y have a dimension that ranges from about 5 nm to 5 um. Of course, there can be other variations, modifications, and alternatives.

(e) In yet an alternative specific embodiment, the present method and structure includes at least two metal plates on adjacent layers, (Mn and Mn+1) and an orthogonal graded via slots that are rotated about 45 degrees with respect to an edge of either metal plates. In a specific embodiment, the via slots include a width that ranges in size from about 50 nm to about 5 um. In a specific embodiment, the slots include a spacing that ranges from about 50 nm to about 5 um. Depending upon the embodiment, the via slots can include a number in either direction of 1, 2, 3 . . . In a specific embodiment, the metal plates X and Y have a dimension that ranges from 5 nm to 5 um. Of course, there can be other variations, modifications, and alternatives.

(f) In a specific embodiment, the present method and structure has at least two sets of crossed metal lines on adjacent layers, (Mn and Mn+1). Rectangular Vn is parallel to Mn+1 and underneath Mn+1 according to a specific embodiment. The metal lines form an array structure that includes "n" rows and "m" columns, where n=1, 2, 3 and m=1, 2, 3 . . . according to a specific embodiment. Metal line and Vn slot width ranges from about 50 nm to about 5 um according to a specific embodiment. A spacing among metal lines ranges from about 5 nm to about 5 um according to a specific embodiment. The length of metal lines each range from about 100 nm to about 100 um according to a specific embodiment. Of course, there can be other variations, modifications, and alternatives.

(g) In yet an alternative specific embodiment, the present method and structure has at least two sets of crossed metal lines on adjacent layers, (Mn and Mn+1) to form an array structure. As shown, the Vn, which is rectangular, is parallel to Mn+1 and underneath the lines representing Mn+1 according to a specific embodiment. In a specific embodiment, the metal line array structure has "n" rows and "m" columns, where n=1, 2, 3 . . . . , and m=1, 2, 3 . . . As shown, the array structure is 45 degree rotated according to a specific embodiment. In a specific embodiment, the metal lines also include a spacing that ranges from 5 nm to 5 um. Additionally, each of the metal lines can have a length that ranges from 100 nm to 100 um according to a specific embodiment. Of course, there can be other variations, modifications, and alternatives.

(h) Still further, the present method and structure includes at least two sets of orthogonal crossed metal lines on adjacent metal layers (Mn and Mn+1). As shown, vias (Vn) are spatially placed at each of the intersections of Mn and Mn+1 according to a specific embodiment. As shown, the metal line and width spacing ranges from about 50 nm to 5 um according to a specific embodiment. The present via size ranges from about 5 nm to about 5 um according to a specific embodiment. Each of the lengths of metal lines ranges from about 100 nm to about 100 um according to a specific embodiment. Of course, there can be other variations, modifications, and alternatives.

(i) Still further, the present method and structure has two sets of orthogonal crossed metal lines on adjacent metal layers (Mn and Mn+1). As shown, vias (Vn) are spatially placed at each of the intersections of Mn and Mn+1. In a specific embodiment, the structure is 45 degree rotated in reference to the direction of other metal lines. As shown, the metal line and width spacing ranges from about 50 nm to about 5 um according to a specific embodiment. Additionally, the via size range from about 5 nm to about 5 um according to a specific embodiment. Each of the metal lines has a length that ranges in size from about 100 nm to about 100 um according to a specific embodiment. Of course, there can be other variations, modifications, and alternatives.

Figure 8:
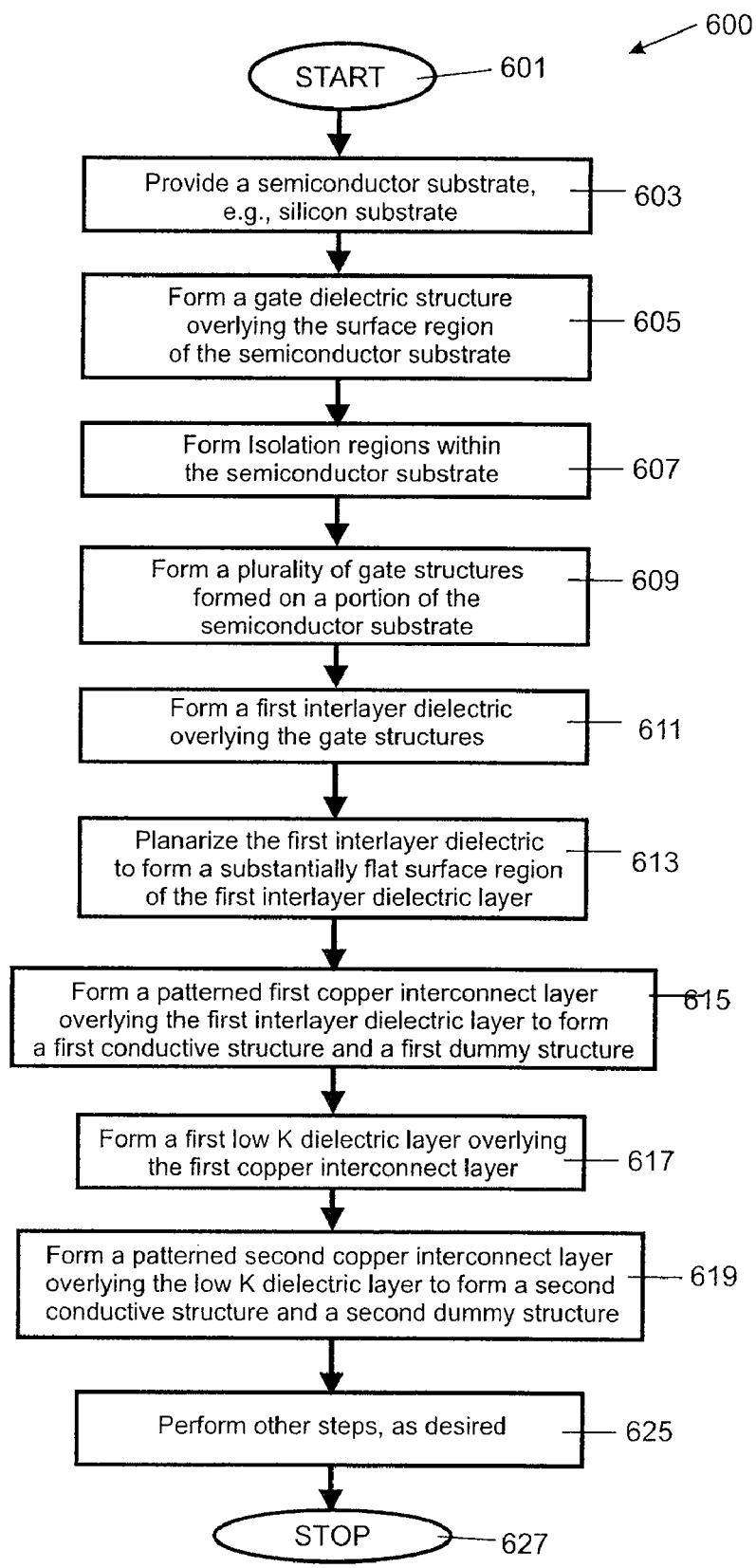
FIG. 8 is a simplified flow diagram of a method for fabricating a dummy structure for an interconnect according to an embodiment of the present invention.

A method for manufacturing a semiconductor device according to an embodiment of the present invention may be outlined as follows (see also FIG. 8):

1. Start, step 601;
2. Provide (step 603) a semiconductor substrate, e.g., silicon substrate.
3. Form (step 605) a gate dielectric structure overlying the surface region of the semiconductor substrate;
4. Form (step 607) isolation regions within the semiconductor substrate;
5. Form (step 609) a plurality of gate structures formed on a portion of the semiconductor substrate;
6. Form (step 611) a first interlayer dielectric overlying the gate structures;
7. Planarize (step 613) the first interlayer dielectric to form a substantially flat surface region of the first interlayer dielectric layer;
8. Form (step 615) a patterned first copper interconnect layer overlying the first interlayer dielectric layer to form a first conductive structure and a first dummy structure;
9. Form (step 617) a first low K dielectric layer overlying the first copper interconnect layer;
10. Form (step 619) a patterned second copper interconnect layer overlying the low K dielectric layer to form a second conductive structure and a second dummy structure;
11. Perform (step 625) other steps, as desired; and
12. Stop, step 627.

The above sequence of steps provides a method according to an embodiment of the present invention. As shown, the method uses a combination of steps including a way of forming a dummy structure (using a dual damascene process) between first and second interconnect layers to support the low K dielectric material, which will be underlying a bonding pad structure. Other alternatives can also be provided where steps are added, one or more steps are removed, or one or more steps are provided in a different sequence without departing from the scope of the claims herein. Additionally, there may be other layers inserted between each of the metal layers described according to an embodiment of the present invention. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device comprising:
   a semiconductor substrate including a surface region;
   a first interlayer dielectric overlying the surface region;
   an interconnect layer overlying the first interlayer dielectric layer;
   a low K dielectric layer overlying the interconnect layer;
   a predetermined shape characterizing the low K dielectric layer;
   a copper interconnect layer overlying the low K dielectric layer; and
   a dummy pattern structure provided within a portion of the low K dielectric layer to provide mechanical support to maintain the predetermined shape of the low K dielectric layer, the predetermined shape being maintained between the interconnect layer and the copper interconnect layer;
   wherein the dummy pattern structure includes a plurality of first bar structures directed in a first direction and a plurality of second bar structures overlying the first bar structures to form a grid structure.

2. The device of claim 1 wherein the dummy pattern structure comprises a first plate, a plurality of via structures, and a second plate, the first plate being coupled to the second plate using the plurality of via structures.

3. The device of claim 1 wherein the dummy pattern structure is a portion of the copper interconnect layer, the portion being free from any electrical connection.

4. The device of claim 1 wherein the dummy pattern structure comprises a plurality of via structures, the plurality of via structures being free from any electrical connection.

5. The device of claim 1 wherein the dummy pattern structure comprises a plurality of conductive segments in a spatial pattern, the spatial pattern being a checkerboard like pattern including the plurality of conductive segments.

6. The device of claim 1 wherein the grid structure includes a plurality open regions, each of the open regions including a portion of the low K dielectric material.

7. The device of claim 1 further comprising a second dielectric layer overlying the copper interconnect structure.

8. The device of claim 1 wherein the predetermined shape is provided within one or more portions of the dummy pattern structure.

9. The device of claim 1 further comprising a second low K dielectric layer overlying the dummy pattern structure and a second copper interconnect overlying the second low K dielectric layer.

10. A method for fabricating a semiconductor device, the method comprising:
    providing a semiconductor substrate including a surface region;
    forming a first interlayer dielectric overlying the surface region;
    forming an interconnect layer overlying the first interlayer dielectric layer;
    forming a low K dielectric layer overlying the interconnect layer, the low K dielectric layer having a predetermined shape;
    forming a copper interconnect layer overlying the low K dielectric layer; and
    whereupon the low K dielectric layer maintains the predetermined shape using a dummy pattern structure provided within a portion of the low K dielectric layer to mechanically support and maintain the predetermined shape of the low K dielectric layer between the interconnect layer and the copper interconnect layer;
    wherein the dummy pattern structure includes a plurality of first bar structures directed in a first direction and a plurality of second bar structures overlying the first bar structures to form a grid structure.

11. The method of claim 10 wherein the dummy pattern structure comprises a first plate, a plurality of via structures, and a second plate, the first plate being coupled to the second plate using the plurality of via structures.

12. The method of claim 10 wherein the dummy pattern structure is a portion of the copper interconnect layer, the portion being free from any electrical connection.

13. The method of claim 10 wherein the dummy pattern structure comprises a plurality of via structures, the plurality of via structures being free from any electrical connection.

14. The method of claim 10 wherein the dummy pattern structure comprises a plurality of conductive segments in a spatial pattern, the spatial pattern being a checkerboard like pattern including the plurality of conductive segments.

15. The method of claim 10 wherein the grid structure includes a plurality open regions, each of the open regions including a portion of the low K dielectric material.

16. The method of claim 10 further comprising a second dielectric layer overlying the copper interconnect structure.

17. The method of claim 10 wherein the predetermined shape is provided within one or more portions of the dummy pattern structure.

18. The method of claim 10 further comprising a second low K dielectric layer overlying the dummy pattern structure and a second copper interconnect overlying the second low K dielectric layer.

19. The method of claim 10 wherein the dummy pattern structure comprises a ring structure, the ring structure sealing a portion of the low K dielectric material.

* * * * *